United States Patent [19]

Keel

[11] Patent Number: 4,602,216

[45] Date of Patent: Jul. 22, 1986

[54] CURRENT MONITORING APPARATUS

[75] Inventor: Jerry L. Keel, Harvest, Ala.

[73] Assignee: Avco Corporation, Huntsville, Ala.

[21] Appl. No.: 548,692

[22] Filed: Nov. 4, 1983

[51] Int. Cl.$^4$ ............................................. G01R 1/04
[52] U.S. Cl. ................................... 324/126; 324/149; 324/72.5; 339/147 R
[58] Field of Search ...................... 324/126, 149, 72.5, 324/149; 339/147 R, 151 R, 182 R, 183, 179; 337/241, 265

[56] References Cited

U.S. PATENT DOCUMENTS

| | | | |
|---|---|---|---|
| 596,850 | 1/1898 | Cook | 339/183 |
| 670,174 | 3/1901 | Grabosch | 324/149 |
| 1,654,278 | 12/1927 | Yaxley | 339/183 |
| 4,052,665 | 10/1977 | Gruenwald | 324/126 |
| 4,423,373 | 12/1983 | LeCroy, Jr. | 324/72.5 |
| 4,464,623 | 8/1984 | Chambon | 324/149 |

Primary Examiner—Reinhard J. Eisenzopf
Assistant Examiner—Vinh Phu Nguyen
Attorney, Agent, or Firm—Robert J. McNair, Jr.; Irwin P. Garfinkle

[57] ABSTRACT

Measuring apparatus is presented which permits monitoring of current consumption of electronic equipment under operating conditions. The apparatus includes a probe-like element shaped to fit into the equipment fuse holder in place of the cartridge fuse and the cap which holds the fuse in place. A pair of test leads serve to encircuit the contacts within the fuse holder with the terminals of an ammeter. Subsequent to the completion of the monitoring act the probe-like element can be removed and the fuse and cap combination reinserted in the equipment.

3 Claims, 3 Drawing Figures

CURRENT MONITORING APPARATUS

BACKGROUND OF THE INVENTION

This application relates generally to the monitoring of power consumed by electronic instruments and in particular relates to test apparatus for providing electrical connections through the fuse holder to permit measurement of the total current consumed by the instrument circuitry.

Electrical testing apparatus is known in the prior art. U.S. Pat. No. 1,984,493 to Pierce is typical. Pierce provides a compact tester having a power cord for connection to a power line. The power line cord of the apparatus to be investigated is then plugged into at least one receptacle on the tester. Circuits within the tester then allow monitoring of such parameters as voltage, current and power consumed by the apparatus under test. For many applications the approach disclosed by Pierce will be satisfactory. However, problems arise when attempting to use such a tester in monitoring some of the extensive and complex electronic equipment installations of today. Many installations comprise several relay racks of equipment interconnected by cables which may run in both overhead trays and under a false floor that also incorporates cooling and dust filter ducts. For these electronic systems the individual power line cords may not be readily accessible after the installation is complete. What is accessible though is the fuse holder which serves to protect each working assembly.

Almost every piece of equipment which consumes electrical power operates through a fuse which is generally accessible on either the back or front panel. The prior art discloses means for testing both fuse holders and cartridge fuses. The U.S. Pat. No. 4,281,888 to Seaman discloses test apparatus for continuity testing all the leads in a fuse block commonly used in the telephone industry. The U.S. Pat. No. 3,820,017 to Reichenbach discloses a continuity tester which allows a fuse to be checked in location. Neither of the above anticipate that the fuse holder is capable of providing contact points to which power monitoring apparatus can be temporarily attached.

SUMMARY OF THE INVENTION

This invention provides apparatus which allows the current consumption of an electrical assembly to be monitored by making connection with leads located in the fuse holder. The fuse holder for each operating entity in an electrical system is encircuited so as to be in series with the power source. The invention utilizes apparatus shaped to fit into the fuse holder replacing the cartridge fuse element and the cap which holds the fuse element in place. Functionally, the invention also includes two test leads which on insertion of the apparatus into the fuse holder, causes one end of each test lead to make electrical connection with a corresponding contact within the fuse holder. The outward extending second ends of the test leads are then connected to the terminals of an ammeter which then monitors current drain of the equipment during system operation.

Fuse holder mountings which accommodate type 3AG and 8AG regular or slow-blow fuses usually extend some 2.0 to 2.5 inches inward through the equipment panel. The cap which secures the fuse within the holder is readily removable by a simple counterclockwise twist of no more than 90 degrees. Removal of the fuse holder cap allows easy withdrawal of the fuse cartridge.

A major object of the invention is to provide a simple, inexpensive apparatus which permits monitoring of current consumption of electronic equipment under actual operating conditions. Measurement of current is achieved by inserting a probe-like element into the fuse holder in place of the original cap and fuse. The probe-like element makes contact with the same two connections within the fuse holder that were completed when the fuse was held in place by the cap.

Another object of the invention is to shorten the time required by a repairman doing preventative maintenance to monitor current consumption of the multiplicity of instruments making up an electronic system.

Basically, the apparatus comprises:

(a) a cap similar to the one removed from the fuse holder and having a conductive cup shaped rear member that is securable in a fuse holder;

(b) a cylindrical shaped cartridge made of insulated material and of the same diameter as the original fuse, the cartridge having an opening through its axial bore;

(c) two insulated test leads, each finished at one end with a test plug capable of being readily connected to the binding post of an ammeter, the second end of the first test lead passing through an opening in the center of cap (a), along the central bore of cartridge (b) and terminating at a conductive element on the far end face of the cartridge, the second end of the second test lead being encircuited to be in contact with the cup of cap member (a).

These and other objects and advantages of the invention, as well as details of illustrative embodiments, will be more fully understood from the following description and drawings.

IN THE DRAWINGS

DETAILED DESCRIPTION OF THE PREFERRED EMBODIMENT

Figure 1:
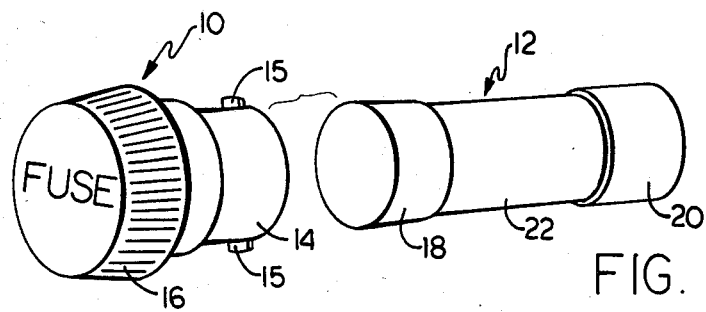
FIG. 1 shows a perspective view of a conventional fuse holder cap and type 3AG fuse.

FIG. 1 shows the cap 10 of a fuse holder which is typical of those mounted in the front panels of test equipment. The cap 10 holds one end of the type 3AG fuse 12. Fuse 12 consists of a glass cylinder 22 having metal cups 18 and 20 on the ends. A fuse element (not shown) is connected between the centers of cups 18 and 20. Cup end 18 of the fuse slips into cap element 14 of the fuse holder. The fuse holder cap 16 may then be inserted into the front panel of the instrument. Bayonet clips 15 allow the cap to be held in the companion member of the fuse holder on execution of a simple twist action. Cap insulator 16 would typically be molded of a high impact black phenolic. In many instances the cup end 20 of the fuse will be pressed against a spring member within the main body of the fuse holder.

Figure 2:
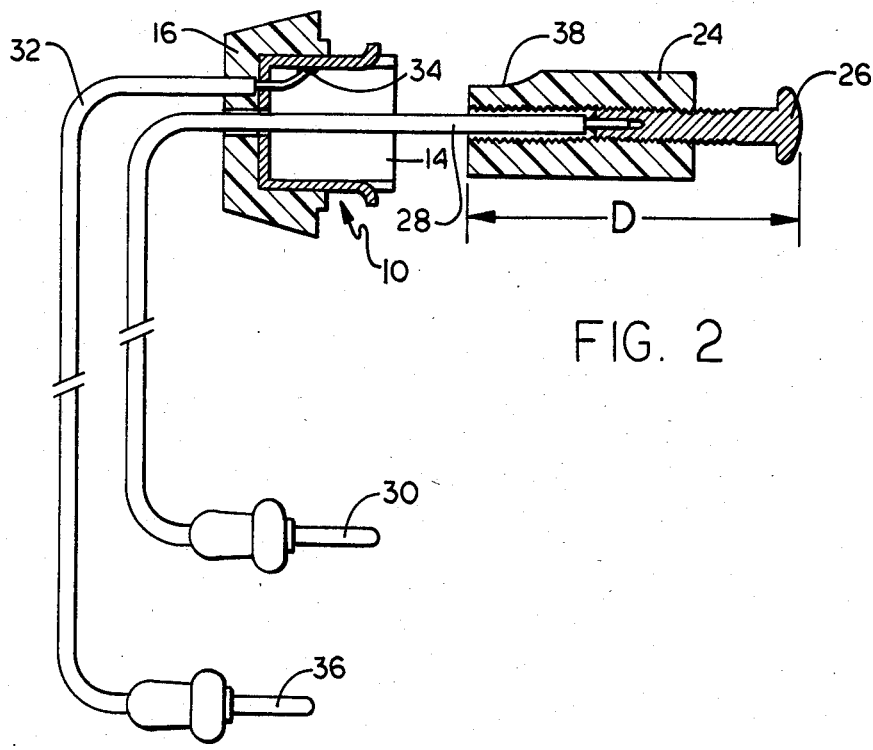
FIG. 2 is a cross sectional view of the current monitor.

To perform the current monitoring function, I replaced the cap 10 and the fuse element 12 with the apparatus shown in FIG. 2. In FIG. 2 there is shown in cross section a fuse holder cap 10 comprising a metal conductive element 14 and a cap insulator 16. Into metal element 14, I insert an insulated cartridge 24. Cartridge 24 was milled from a cylindrical length of nylon. A threaded bore was formed in the center of the nylon cylinder. In the unit reduced to practice an 0.75 inch long #4-40 pan head machine screw 26 was inserted in the nylon cartridge. As shown in FIG. 2, the end of machine screw 26 had an 0.062 inch hole drilled therein. An insulated first conductive test lead 28 of a diameter which would readily pass through the bore of the nylon cylinder was then stripped at the end, tinned and soldered in the hole formed in the small end of screw 26. Screw 26 with test lead attached was then screwed into the nylon cylinder 24 a sufficient distance so that the dimension-D shown in FIG. 2 was the same as the overall length of fuse 12 shown in FIG. 1.

Test lead 28 was then passed through a hole formed in the center of fuse cap 10. The second end of test lead 28 terminates at a test plug 30 which allows ready connection to a current reading instrument of conventional design. One end of a second conductive test lead 32 is stripped and tinned so as to enable it to pass through a second hole formed in the fuse holder cap 10. The tinned end of the second conductive test lead is then attached as by soldering to the sidewall of metal element 14. The second end of test lead 32 terminates at a second test plug 36. In some instances a small flat 38 needs to be milled onto the end of insulated cartridge 24 in order to accommodate the protrusion formed in the attachment of second conductive test lead 32 to the inside wall of element 14 at point 34.

Cartridge 24 is next assembled into fuse holder cap 10 and the combination inserted into the fuse holder of the test instrument whose operating current is to be monitored. Monitoring is done by attaching test plugs 30 and 36 to an appropriately scaled current meter. The FIG. 2 apparatus replaces the fuse and fuse cap shown in FIG. 1 during the current monitoring tests. After an operating current profile has been measured the FIG. 2 apparatus can be removed and the FIG. 1 units reinstated in the instrument.

The bayonet cap fuse holder shown in FIGS. 1 and 2 is intended to be exemplary. For those implementations wherein the cap contains the spring element which holds the fuse in place a slightly different implementation would be used. It is important that a fuse holder cap of the same design as that mounted in the test instrument be used in preparing the current monitor assembly similar in function to that shown in FIG. 2.

Figure 3:
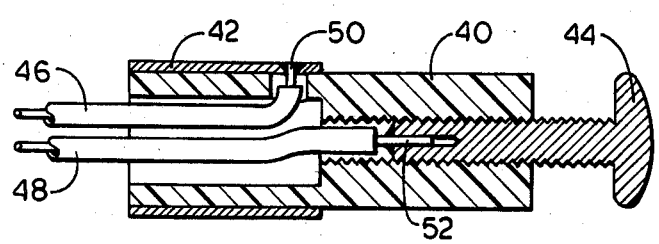
FIG. 3 is a cross sectional view of an alternate implementation of the monitor.

FIG. 3 shows an alternate implementation of the invention. Insulated cartridge 40 has a metal collar 42 attached to one end as by cementing. The bore of cartridge 40 is threaded so as to accommodate a pan head machine screw 44. Machine screw 44 has a hole drilled in the end which allows attachment of one end 52 of a stripped and tinned insulated test lead 48. A second test lead 46 also passes along the enlarged central bore of cartridge 40 and is attached as by soldering to the metal collar 42. This is done by drilling a radial hole 50 through the side of collar 42 and cartridge 40. With the FIG. 3 configuration only a single hole needs to be drilled through the end of the fuse holder cap. The FIG. 3 implementation thus replaces the fuse element shown in FIG. 1 allowing current to be measured and monitored via test leads 46 and 48.

As implemented, my invention provides a direct measurement of operating current. However, it appears equally feasible to assemble a device similar to that shown in FIG. 3 which would measure voltage drop. For example, fuses normally come in standard sizes of 3, 5, 10, 15, etc. amperes. A replacement cartridge and fuse holder cap would be configured wherein the two test leads provided a measurement of the voltage drop across a resistive element within the cartridge. The elements within the cartridge could then be configured to have a specific voltage drop (for example, 10 mv) for a five amp current drain. A voltage measurement taken across the test leads would then be proportional to the current flow within the instrument.

Thus, there has been described, in accordance with the invention a current monitoring apparatus which fully meets the objects and advantages outlined above. It is recognized that others will be able to make minor changes without departing from the invention. For example, the bore of the insulated cartridge (FIG. 3, element 40) does not have to be threaded. Rather, the bore could be smooth to accept a smooth shafted conducting (FIG. 3, element 44) member of slightly smaller diameter. A coil spring between the end of the cartridge and the conductive end cap would then keep the combination extended the proper length within the fuse holder. Accordingly, it is intended to embrace all such minor variations that fall within the scope of the following claims.

I claim:

1. Apparatus for measuring operating current consumption of an instrument by removing the fuse and fuse retainer cap from the fuse holder of the instrument and inserting therein a probe element which serves to encircuit the terminals of an ammeter with first and second contact locations within the fuse holder that were completed when the fuse was held in place by the cap, the apparatus comprising:

a cylindrical non-conductive cartridge arranged to fit into said fuse holder, said cartridge having an open first end, a hollow central bore and a second end, the second end of said cartridge terminating at a conductive element positioned to make electrical contact with said second contact location in said fuse holder;

a cap arranged to secure said non-conductive cartridge in said fuse holder, said cap having an opening along its central axis and a conductive cup shaped rear member for contacting the first contact location in said fuse holder;

a first test lead having an insulated covering, one end of said test lead passing through the opening in the central axis of said cap thence along the open bore of said cartridge and terminating with electrical connection to said conductive element at the second end of said cartridge, the second end of said test lead terminating at a test plug which allows ready connection to one terminal of said ammeter; and a second test lead having an insulated covering, one end of said second test lead being arranged to be electrically connected to the metal cup shaped member, the second end of said second test lead terminating at a test plug which allows ready connection to a second terminal of said ammeter.

2. The invention as defined in claim 1 wherein said conductive element at the second end of said cartridge comprises a pan head machine screw having a threaded shank which mates with threads tapped into the central bore of said cartridge.

3. The invention as defined in claim 1 wherein the cap is secured in the fuse holder by bayonet clips extending radially from the conductive cup member of said cap.

* * * * *